United States Patent
Chiu et al.

(10) Patent No.: US 8,604,549 B2
(45) Date of Patent: Dec. 10, 2013

(54) MULTI-GATE FIELD-EFFECT TRANSISTOR WITH ENHANCED AND ADAPTABLE LOW-FREQUENCY NOISE

(75) Inventors: Tang-Jung Chiu, Hsinchu (TW); Jeng Gong, Hsinchu (TW); Hsin Chen, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 34 days.

(21) Appl. No.: 13/300,248

(22) Filed: Nov. 18, 2011

(65) Prior Publication Data

US 2012/0168868 A1  Jul. 5, 2012

(30) Foreign Application Priority Data

Nov. 19, 2010  (TW) ................................ 99139960 A

(51) Int. Cl.
  *H01L 29/66*  (2006.01)

(52) U.S. Cl.
  USPC ..... 257/365; 257/374; 257/510; 257/E29.254

(58) Field of Classification Search
  USPC ............................ 257/365, 374, 510, E29.254
  See application file for complete search history.

(56) References Cited

U.S. PATENT DOCUMENTS 4,290,078 A * 9/1981 Ronen ........................... 257/409
2009/0108362 A1* 4/2009 Moriwaki ..................... 257/368

* cited by examiner

*Primary Examiner* — Tan N Tran
(74) *Attorney, Agent, or Firm* — Muncy, Geissler, Olds & Lowe, PLLC

(57) ABSTRACT

A field-effect transistor has an extra gate above a shallow trench isolation (STI) to enhance and to adapt the low-frequency noise induced by an STI-silicon interface. By changing the voltage applied to the STI gate, the field-effect transistor is able to adapt its low-frequency noise over four decades. The field-effect transistor can be fabricated with a standard CMOS logic process without additional masks or process modification.

4 Claims, 14 Drawing Sheets

US 8,604,549 B2

MULTI-GATE FIELD-EFFECT TRANSISTOR WITH ENHANCED AND ADAPTABLE LOW-FREQUENCY NOISE

FIELD OF THE INVENTION

The present invention is related generally to a semiconductor transistor and, more particularly, to a field-effect transistor (FET).

BACKGROUND OF THE INVENTION

As the semiconductor technology heads towards miniaturizing the transistor size, the transistor noise increases dramatically, degrading the accuracy and the reliability of integrated circuits. Various techniques have thus been proposed for suppressing the transistor noise. Contrarily, several applications have found noise useful for data encryption, for perturbative learning in bio-inspired computations, for stochastic arithmetic, and for probabilistic modeling. The arithmetic architecture with noisy transistors has been also proposed. These applications normally require multichannel uncorrelated noise in hardware implementation. While conventional noise generators are based on cellular automata, the feasibility of using the transistor noise has also been exploited by using silicon nitrides to increase interface traps and miniaturizing transistors to have single-oxide traps. However, these methods simply enhance the noise to a usable extent without controlling the exact noise level.

FIG. 1 shows the layout of a typical FET and a corresponding cross-sectional view thereof. As shown in the upper part of FIG. 1, the layout includes a gate 16 above an active region 14, and a source contact 11 and a drain contact 13 at two opposite sides of the gate 16, respectively. Cut from the line A-A in the layout, the corresponding cross-sectional view of the FET is shown in the lower part of FIG. 1. In standard CMOS logic technology, a shallow trench isolation (STI) 12 is formed on a silicon substrate 10 to define the active region 14, and the gate 16 is deposited above the active region 14, so that the gate voltage $V_G$ applied to the gate 16 can modulate the channel 18 under the surface of the active region 14. The interface between the gate dielectric 20, which is sandwiched between the gate 16 and the channel 18, and the active region 14 has many dangling bonds that behave as traps, which will trap and de-trap carriers in the channel 18 and thereby induce low-frequency fluctuation. In the fabrication of FETs, it always employs special process, for example, the RCA clean applied to the surface of the active region 14, to minimize the dangling bonds in the interface and thus reduce the low-frequency noise induced by the interface. U.S. Pat. Publication Nos. 20070296025 and 20100057820 add a trap insulator in the gate dielectric 20 to provide more traps to enhance the low-frequency noise, while the level of the generated low-frequency noise can not be modulated by external voltages or currents. U.S. Pat. Publication No. 2009/0309646 enhances the fluctuation frequency of the low-frequency noise by changing the material of the channel 18, the material of the source and drain, or the shape of the liner covering the gate 16. However, these arts still can not adapt the amplitude or frequency of the low-frequency noise by external voltages or currents.

On the other hand, it is known that STI edge effect will induce noise in flash memories. It is pointed out by R. V. Wang, Y. H. Lee, Y. L. R. Lu, W. McMahon, S. Hu, and A. Ghetti, "Shallow trench isolation edge effect on random telegraph signal noise and implications for flash memory," IEEE Trans. Electron Devices, vol. 56, no. 9, pp. 2107-2113, September 2009, that rounding STI corners may significantly decrease the number of the stress induced traps.

To date, additional masks or process modification are required to enhance the low-frequency noise of a FET, and thus the FET can not be fabricated with a standard CMOS logic process. Moreover, no prior arts have been found for a FET to adapt its low-frequency noise in amplitude.

SUMMARY OF THE INVENTION

An objective of the present invention is to provide a FET with enhanced low-frequency noise.

Another objective of the present invention is to provide a FET with adaptable low-frequency noise.

A further objective of the present invention is to provide a FET with enhanced low-frequency noise that can be fabricated in standard CMOS logic technology without additional masks.

A FET according to the present invention has an extra gate above an STI to enhance and to adapt the low-frequency noise induced by the STI-silicon interface.

By changing the voltage applied to the STI gate, the FET is able to adapt its low-frequency noise over four decades.

BRIEF DESCRIPTION OF THE DRAWINGS

These and other objectives, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 2:
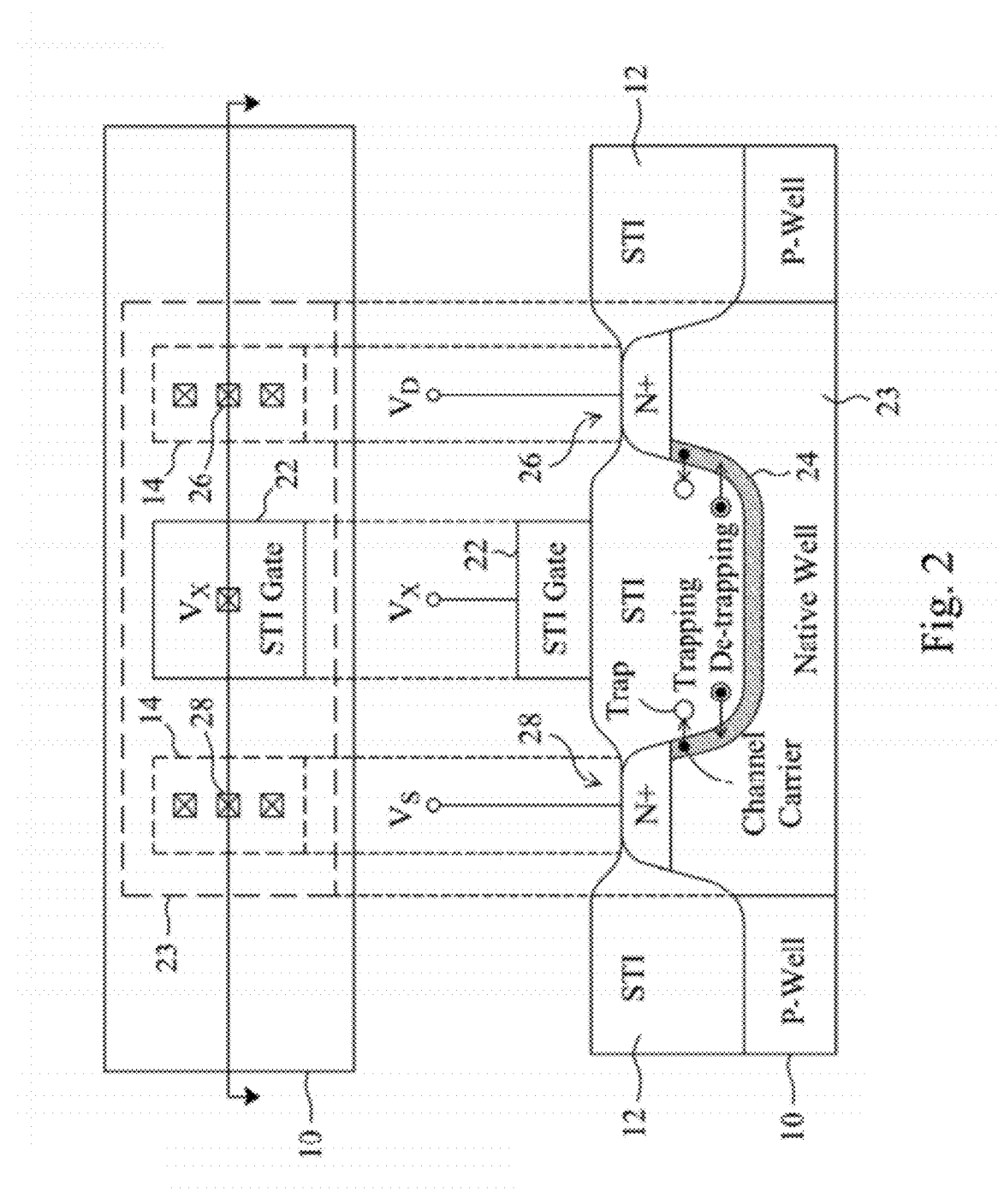
FIG. 2 is a diagram for illustrating the principle of the present invention.

Referring to FIG. 2 for the principle of the present invention, in which the upper part shows the layout of an n-type FET, and the lower part shows a corresponding cross-sectional view thereof, an STI gate 22 locates on top of an STI 12, encouraging channel carriers to flow along the STI edges 24 to induce noise. Active regions 14 at the right and left sides of the STI gate 22 are heavily doped to form the drain and source of the n-type FET, which have a drain contact 26 and a source contact 28 thereon, respectively. When a positive voltage $V_X$ is applied to the STI gate 22, inversion charges are induced at the STI edges 24, and channel carriers will flow between the drain and the source along the STI edges 24. Since the STI-silicon interface at the STI edges 24 has a lot of traps, which will trap and de-trap the channel carriers, a relatively large noise will be induced. When the positive voltage $V_X$ increases, the concentration of the channel carriers induced at the STI edges 24 increases, so the probability for the carriers to interact with the interface traps increases, thereby enhancing the noise level.

Figure 1:
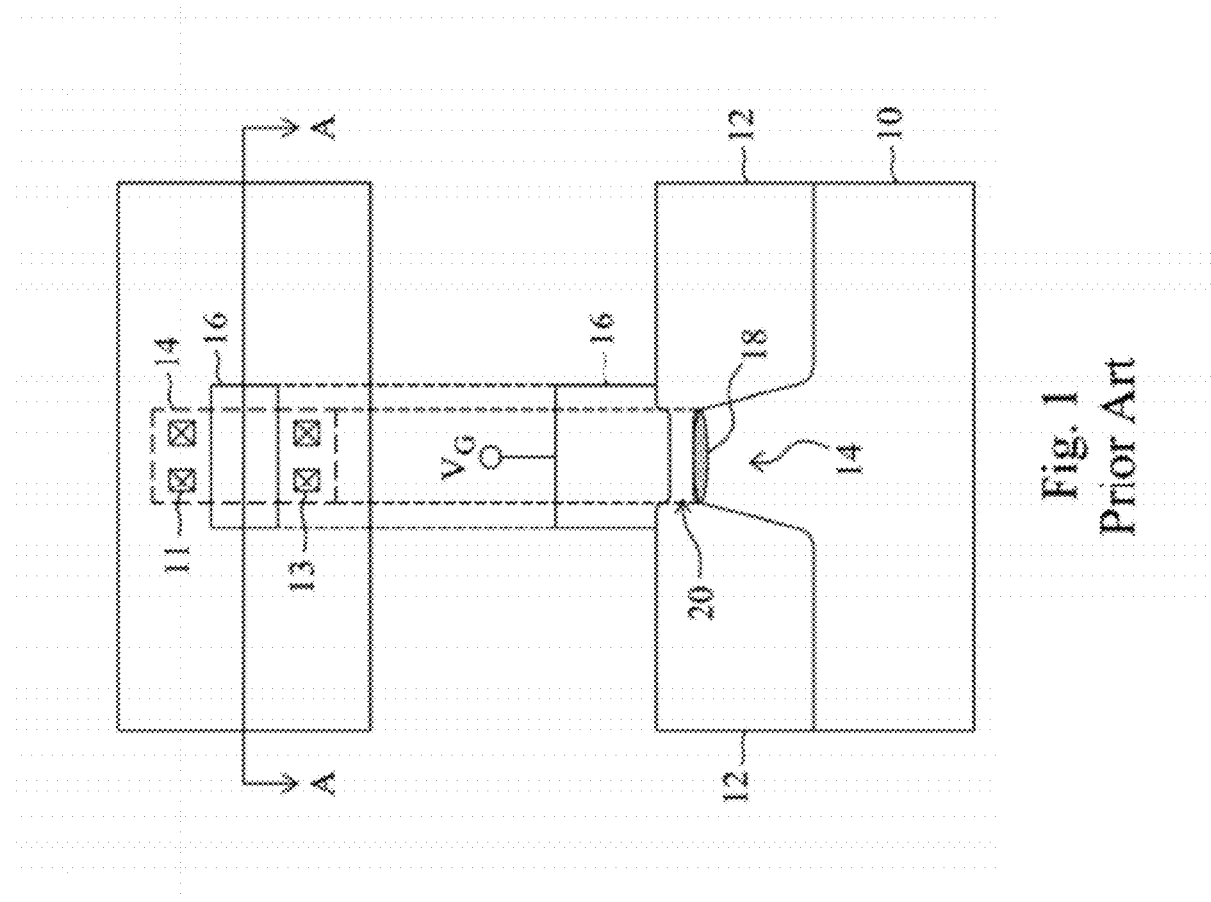
FIG. 1 is a diagram showing the layout of a typical FET and a corresponding cross-sectional view thereof.

In addition, since the STI 12 is much thicker than the gate dielectric 20 in an ordinary FET as shown in FIG. 1, when the STI gate voltage $V_X$ is equal to the gate voltage $V_G$ of the ordinary gate 16, the channel carriers induced at the STI edges 24 is much less than that of the ordinary FET. To increase the channel carriers at the STI edges 24, a P-well-blocked mask may be employed to block the P-well engineering on the n-type FET, so as to form a low doping concentration native well 23 and a high doping concentration P-well on the silicon substrate 10. The native well 23 is near the STI edges 24, thereby significantly decreasing the threshold voltage of the n-type FET and increasing the concentration of channel carriers at the STI edges 24. Consequently, the probability for carriers to interact with the interface traps at the STI edges 24 increases to enhance noise level. However, even if there is no native well formed near the STI edges 24, as long as the STI gate voltage $V_X$ is large enough, enhancement of noise level can still be achieved. While an n-type FET is used to illustrate the principle of the present invention, it is appreciated that the principle is also applicable to p-type FETs.

Figure 3:
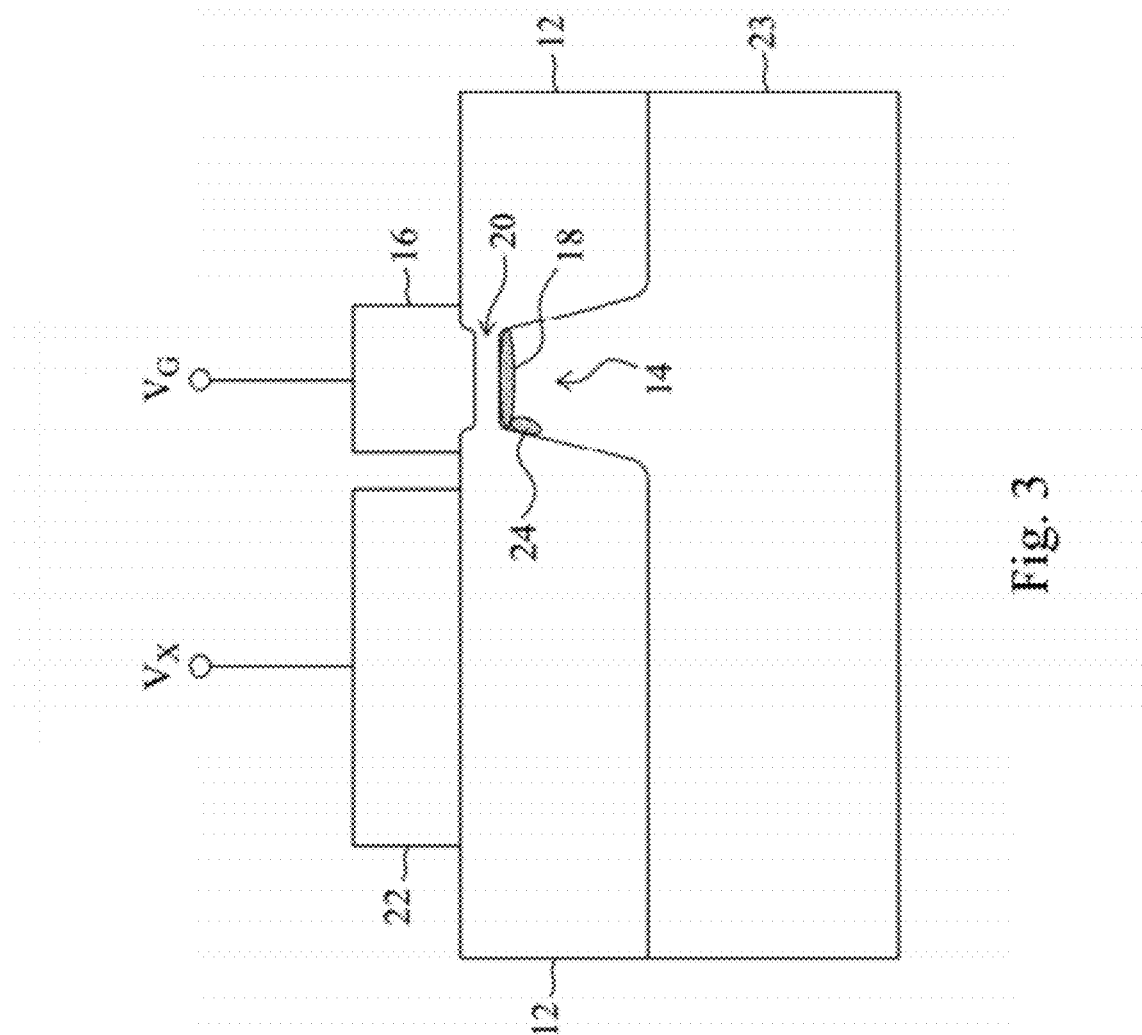
FIG. 3 is a diagram showing a cross-sectional view of a FET in a first embodiment according to the present invention.

FIG. 3 shows a cross-sectional view of a FET in a first embodiment according to the present invention, which is obtained by adding an extra gate 22 above the STI 12 of the FET structure shown in FIG. 1. This FET thus has two gates 16 and 22. The main gate 16 locates on top of the channel 18, controlling the channel currents like an ordinary gate. The STI gate 22 locates on top of the STI 12, encouraging channel carriers to flow along the STI edges 24 to induce noise.

The STI gate 22 may be made in the same process of making the main gate 16, so the FET structure shown in FIG. 3 can be fabricated with a standard CMOS logic process without additional masks or process modification.

Figure 4:
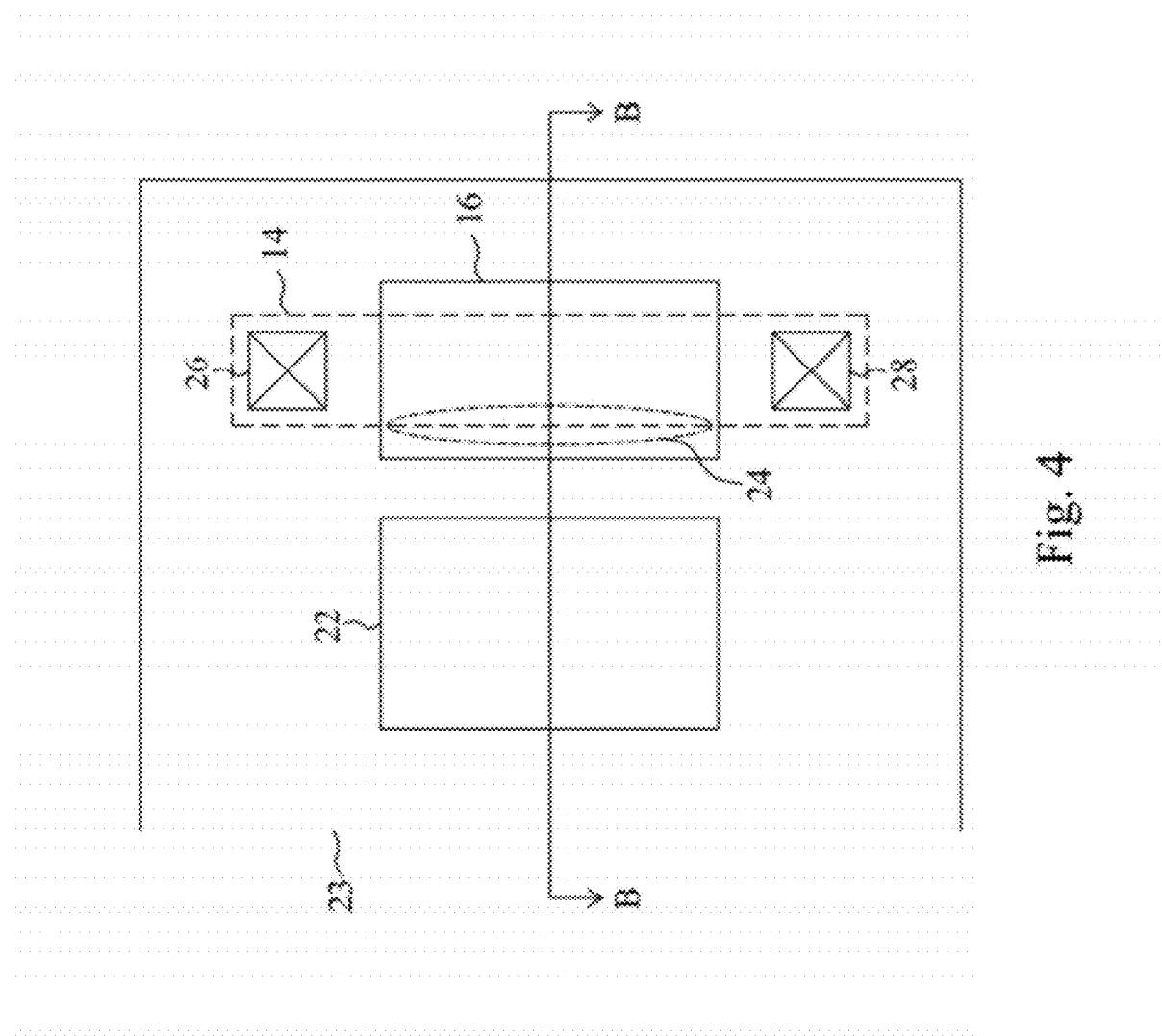
FIG. 4 is a diagram showing the layout of an embodiment containing the structure shown in FIG. 3.

FIG. 4 is a diagram showing the layout of an embodiment containing the FET structure shown in FIG. 3, in which a drain contact 26 and a source contact 28 locate above and below the main gate 16, respectively, and the STI gate 22 locates at the left side of the main gate 16. The cross-sectional view shown in FIG. 3 is obtained by cutting from the line B-B in the layout of FIG. 4.

Referring to FIG. 3 and FIG. 4, it is well known that when a voltage $V_G$ is applied to the main gate 16, inversion charges are induced at the channel 18 thereunder, so a current may be generated between the drain contact 26 and the source contact 28. In this state, the FET acts as a normal FET and has small low-frequency noise. When a voltage $V_X$ is applied to the STI gate 22, inversion charges are induced at the STI edges 24, so channel carriers flow along the STI edges 24 and thus induce noise. Different from the gate dielectric 20, there are a lot of traps in the STI-silicon interface at the STI edges 24, so the resultant noise is relatively large. When the STI gate voltage $V_X$ increases, the concentration of the channel carriers induced at the STI edges 24 increases, so the probability for the carriers to interact with the interface traps increases, thereby enhancing the noise level. Preferably, the STI gate 22 is as close to the main gate 16 as possible, so as to allow the STI gate voltage $V_X$, even when being small, can induce inversion charges significantly. The resultant noise level is highly related to the width of the channel 18 and the length of the channel 18 at the STI edges 24. The narrower the channel 18 is, the easier can the carriers be trapped and de-trapped, which enhances the noise level.

Figure 5:
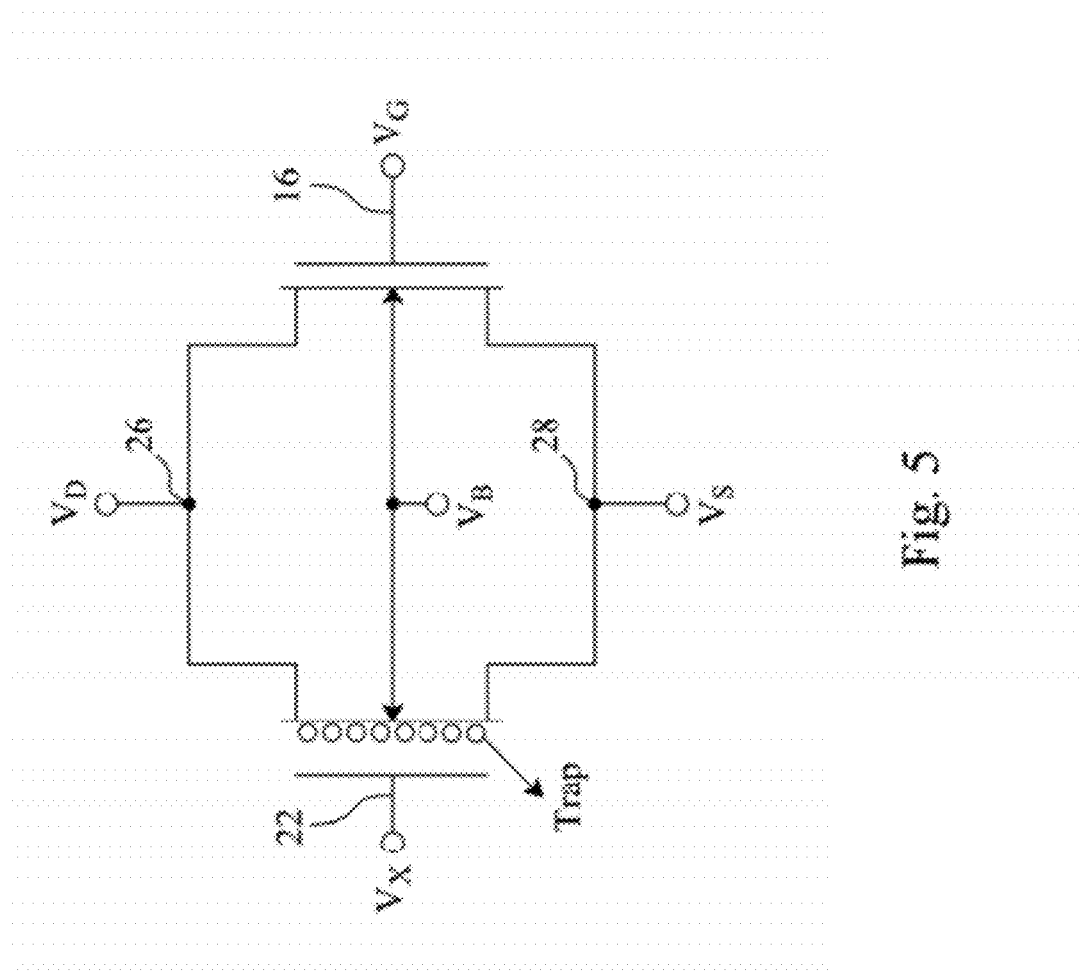
FIG. 5 is a circuit model of the FET structure shown in FIG. 3.

The structural feature of the FET shown in FIG. 3 implies that its electrical characteristics could be modeled as two FETs connected in parallel as shown in FIG. 5, one controlled by the main gate 16 and the other by the STI gate 22. The main gate 16, the source contact 28 and the drain contact 26 establish a main FET as shown at the right side, and the STI gate 22, the source contact 28 and the drain contact 26 establish an STI FET having many traps as shown at the left side. The FET controlled by the main gate 16 operates as a normal one. Since there are almost no traps in the channel of the main FET, when carriers flow through the channel, the induced noise is very small. The FET controlled by the STI gate 22 has many traps which will trap and de-trap carriers, so when carriers flow through the channel, the induced noise is relatively large. However, since the STI 12 is much thicker than the gate dielectric 20, the current controlled by the STI gate 22 is much smaller than the current controlled by the main gate 16. As shown in the model of FIG. 5, the main gate 16 dominates the current of the FET, and the STI gate 22 modulates the noise level.

Figure 6:
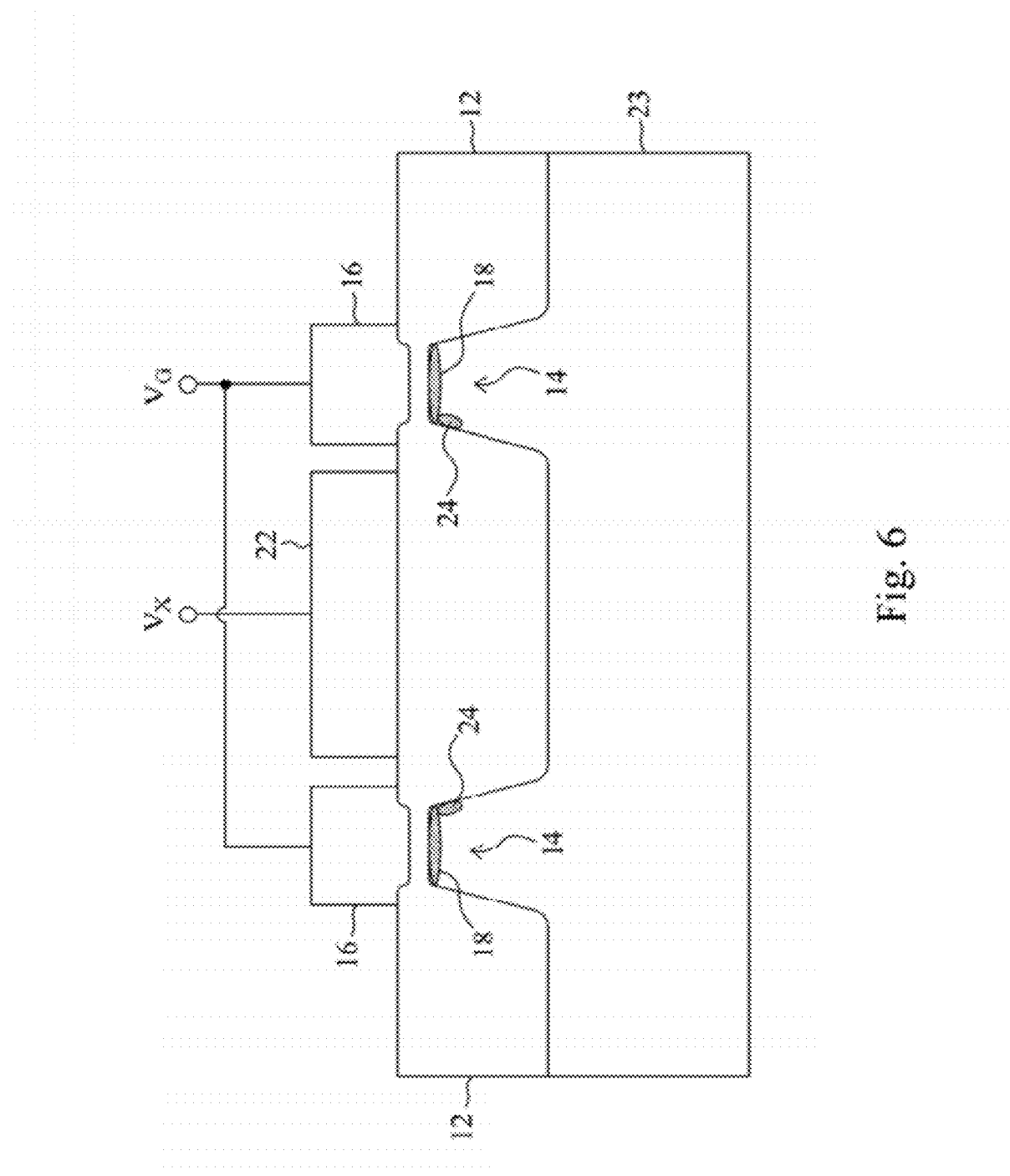
FIG. 6 is a diagram showing a cross-sectional view of a FET in a second embodiment according to the present invention.

FIG. 6 is a diagram showing a cross-sectional view of a FET in a second embodiment according to the present invention, which is obtained by doubling the structure of FIG. 3 to a bilateral structure whose principle and operation are identical to those described for FIG. 3.

Figure 7:
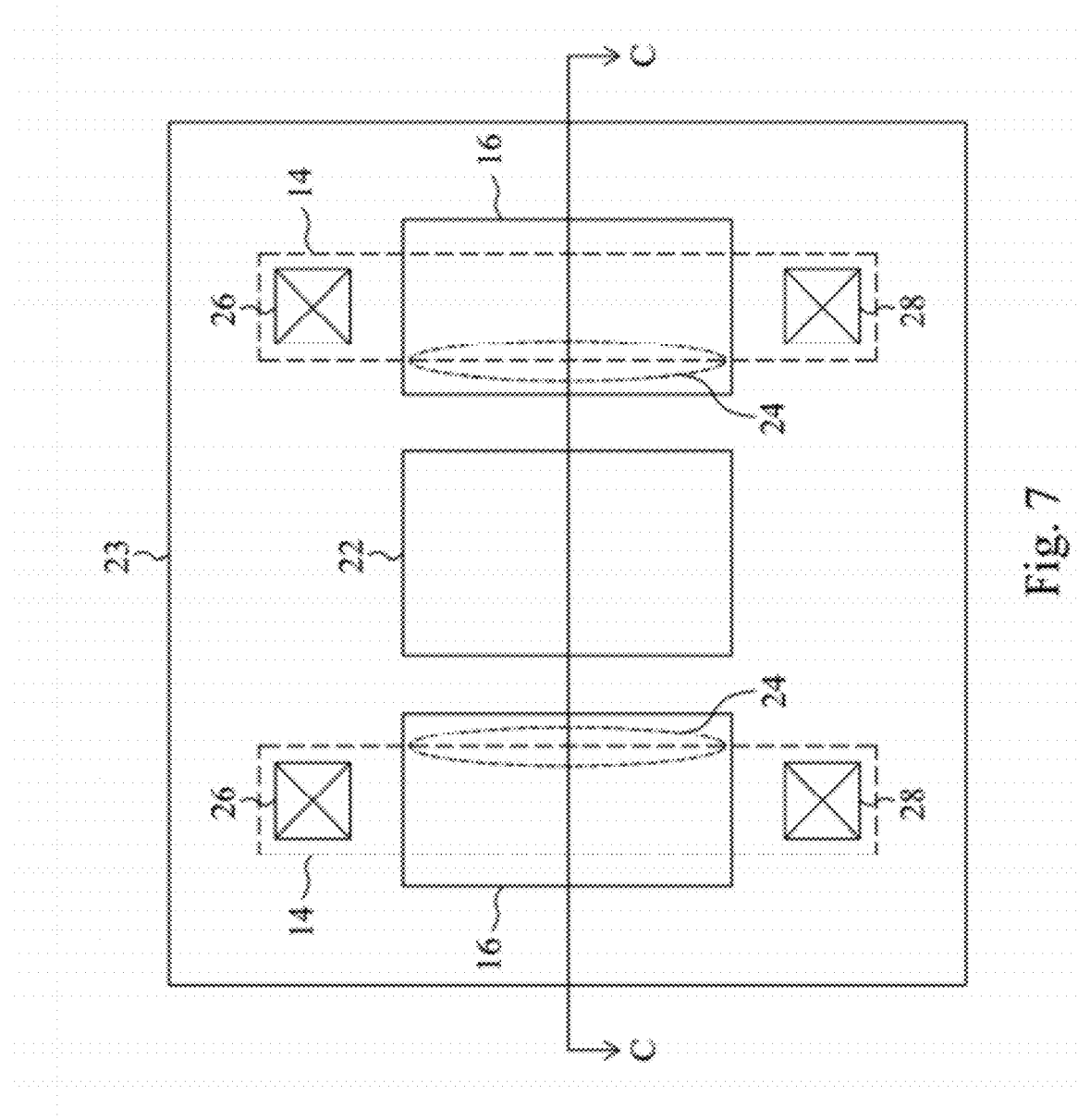
FIG. 7 is a diagram showing the layout of an embodiment containing the structure shown in FIG. 6.

FIG. 7 is a diagram showing the layout of an embodiment containing the structure shown in FIG. 6, in which drain contacts 26 and source contacts 28 locate above and below the main gate 16, respectively, and the STI gate 22 locates between the two portions of the main gate 16. The cross-sectional view of FIG. 6 is taken along line C-C in the layout of FIG. 7.

Figure 8:
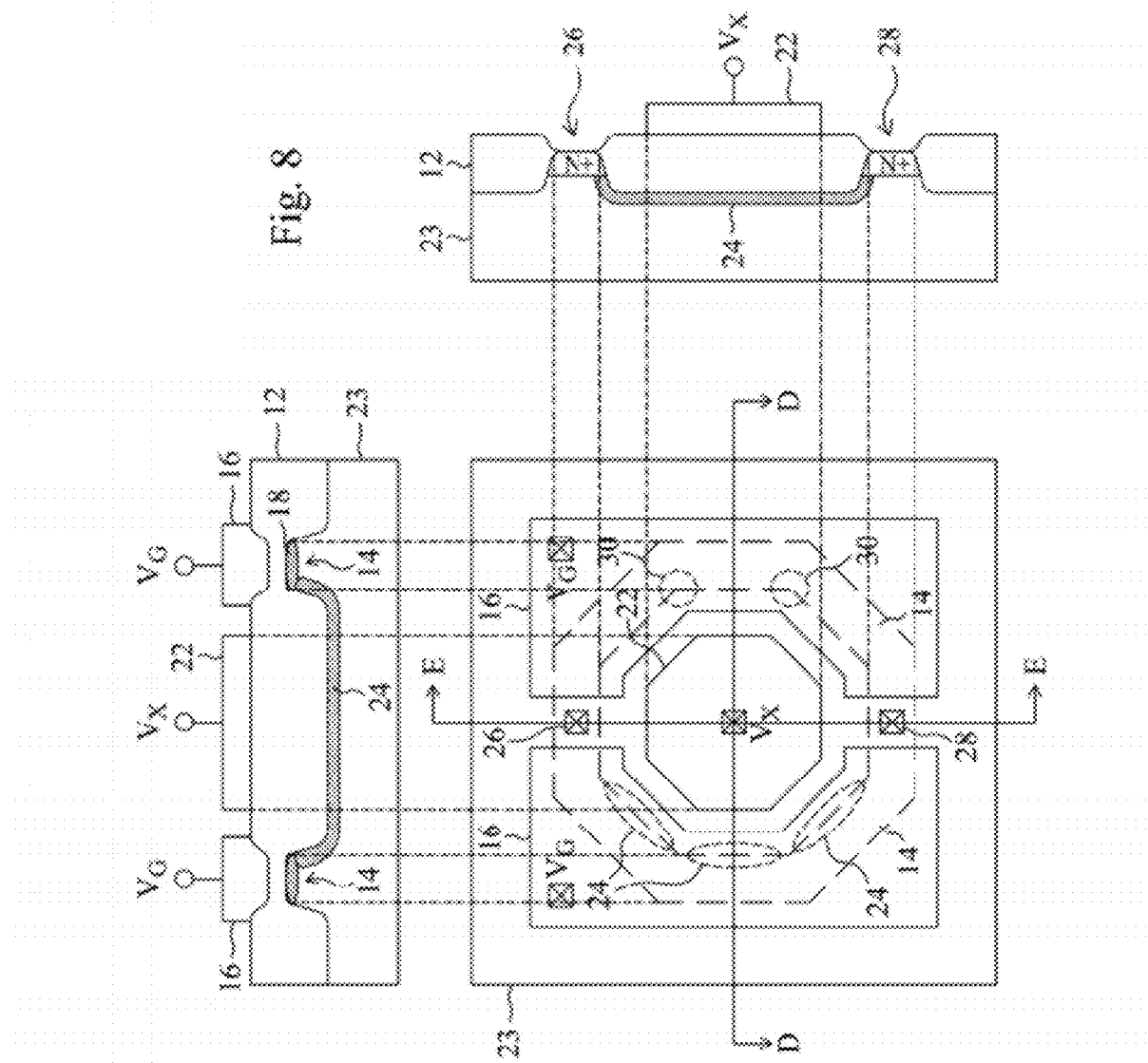
FIG. 8 is a diagram showing the layout and the cross-sectional views of an octagonal dual-gate FET according to the present invention.

FIG. 8 is a diagram showing the layout and the cross-sectional views of an octagonal dual-gate FET (ODGFET) according to the present invention, in which the cross-sectional view at the upper part is taken along line D-D in the layout, and the other cross-sectional view at the right side is taken along line E-E in the layout. In this ODGFET, the active region 14 is an octagonal ring encircling the octagonal STI gate 22. A drain contact 26 and a source contact 28 locate above and below the STI gate 22, respectively. The overlapping regions between the main gate 16 and the active region 14 define the polygonal channels 18. In other embodiments, the active region 14 may have other non-straight layouts.

In the ODGFET shown in FIG. 8, since the channel 18 is polygonal, the probability for channel carriers to interact with the STI edges 24 increases further. Moreover, as the trap density at STI-silicon interfaces depends strongly on the STI geometry, the eight 135° STI corners 30 are likely to introduce more interface traps and thus noise.

For demonstrating the effect of the present invention, an n-type ODGFET having the structure shown in FIG. 8 is fabricated in standard 0.18 μm CMOS logic technology. The effective channel length and width are 8 μm and 0.42 μm, respectively. Such a large length-width ratio and the octagonal geometry increase the probability for channel carriers to interact with the STI edges 24. To enhance the STI gate's effect, a rectangular P-well-blocked mask is employed to block the P-well engineering, so as to form a native well 23, thereby decreasing the doping concentration of the channel 18 and at the STI edges 24 and thus the threshold voltage. This ODGFET is used for various tests and measurement for analyzing its performance. To investigate whether the geometry of the STI plays an important role, a rectangular FET consisting of two straight channels adjacent to straight STI edges, as shown in FIG. 7, is also fabricated with identical channel width and length (W/L=0.42 μm/8 μm) in the same CMOS logic technology for comparison. A rectangular P-well-blocked mask is also employed to form a native well around the STI edges 24 to decrease the p-type doping concentration around the STI edges 24, to thereby increase the carrier concentration around the STI edges 24.

Figure 9:
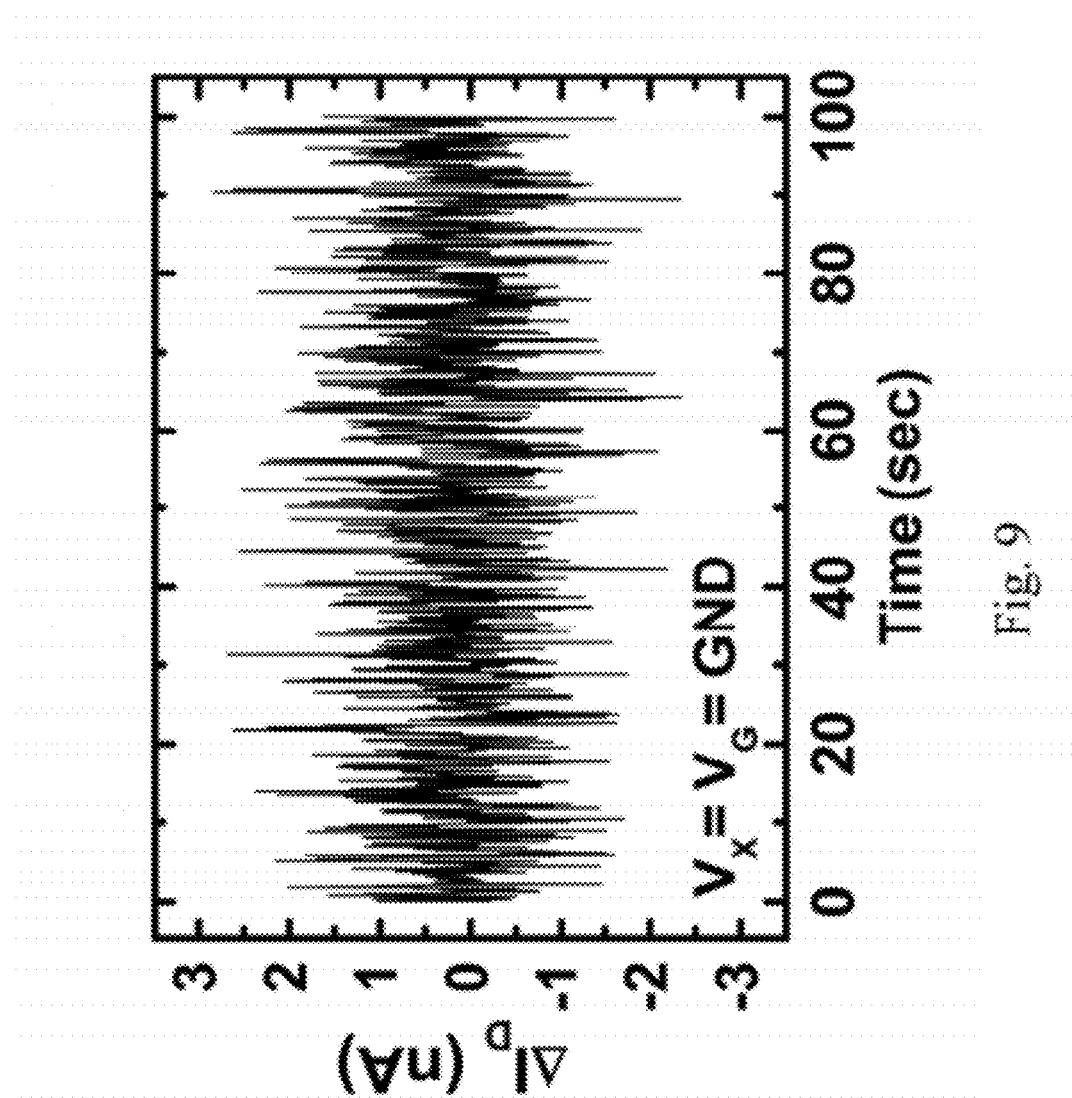
FIG. 9 is a diagram showing the fluctuation of the drain current when the octagonal dual-gate FET shown in FIG. 8 has its main gate and STI gate grounded.
Figure 10:
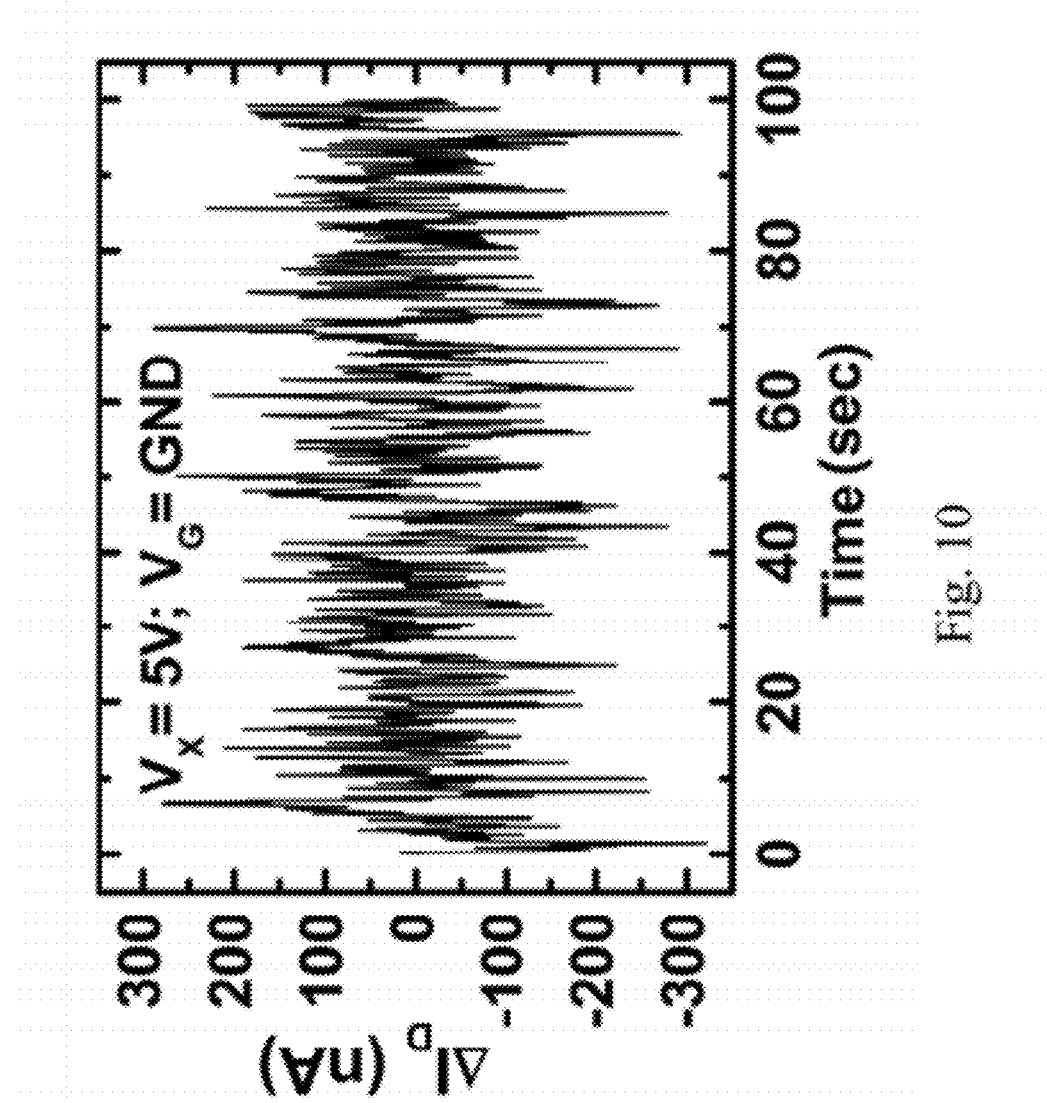
FIG. 10 is a diagram showing the fluctuation of the drain current when the octagonal dual-gate FET shown in FIG. 8 has its main gate grounded and its STI gate applied with 5V.

FIG. 9 shows the fluctuation $\Delta I_D$ of the drain current when the ODGFET shown in FIG. 8 is under $V_D$=2.8V and $V_B=V_S=V_X=V_G$=GND, and FIG. 10 shows the fluctuation $\Delta I_D$ of the drain current when the ODGFET shown in FIG. 8 is under $V_D$=2.8V, $V_X$=5V and $V_B=V_S=V_G$=GND. FIG. 9 and FIG. 10 clearly show that when the STI gate voltage $V_X$ increases, the fluctuation $\Delta I_D$ of the drain current increases. In other words, the noise level can be modulated by changing the STI gate voltage $V_X$.

Figure 11:
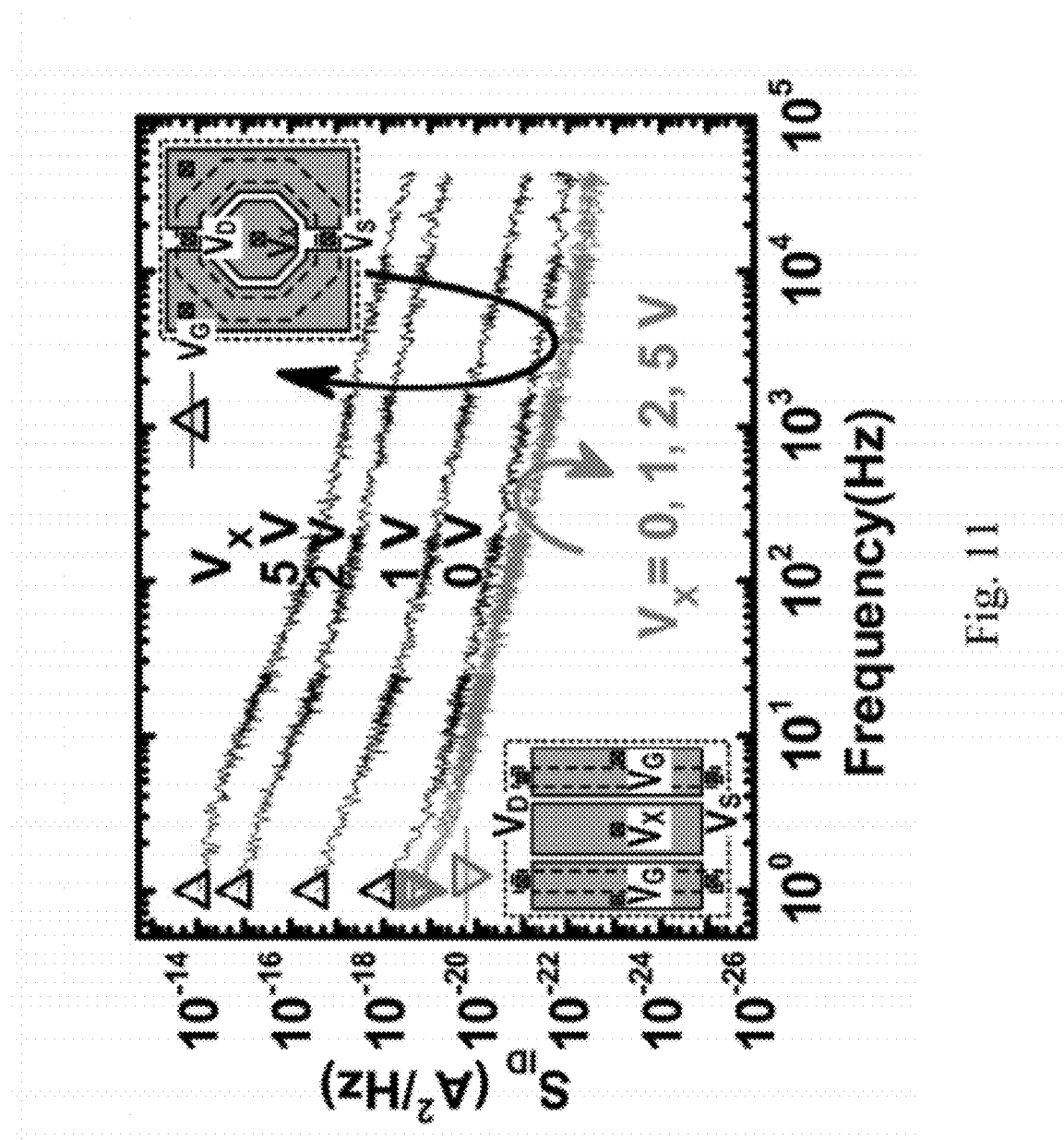
FIG. 11 is a diagram showing the comparison of noise adaptability between the octagonal dual-gate FET shown in FIG. 8 and a rectangular FET.

To investigate the effect of the STI geometry, the low-frequency noise of the ODGFET shown in FIG. 8 and the rectangular FET shown in FIG. 7 is first compared. With $V_D$=2.8V, $V_G=V_S=V_B$=0V, and $V_X$ varying from 0V to 5V, the noise spectra ($S_{ID}$) measured by a noise analyzer BTA 9812B is shown in FIG. 11. The lower curves indicated by inverted triangles are the measured results of the rectangular FET, which shows that the STI gate 22 of the rectangular FET has almost no impact on the noise magnitude. The curves in the upper part of FIG. 11 indicated by triangles are the measured results of the ODGFET, which shows that the ODGFET exhibits relatively greater noise level and its STI gate 22 is able to modulate the noise level over four decades when the voltage of the STI gate 22 changes from 0V to 5V. This dramatic difference depends on the fact that the active region 14 of the ODGFET is in a ring-like shape, so when the STI gate 22 at the center is applied with a positive voltage $V_X$, channel carriers flow along the inner periphery of the ring-like active region 14 (the STI edges 24), as shown in the layout of FIG. 8, thereby increasing the probability for channel carriers to interact with the interface traps at the STI edges 24. The ODGFET has polygonal geometry and thus includes many corners. In the STI process of semiconductor, an irregular shape (i.e. a corner structure) naturally has relatively more dangling bonds at interface. Thus, there are more traps at the eight STI corners 30. Furthermore, since the electric field around the corners of the polygonal STI gate 22 (not limited to the octagonal layout) has fringing field effect, there is a relatively large electric field intensity around the corners of the polygonal STI gate 22, and thereby induces more channel carriers around the STI corners 30 to interact with the interface traps around the STI corners 30, so as to enhance the noise level. Additionally, the bottom of the STI 12 under the STI gate 22 can also induce channel carriers, which interact with the interface traps at the STI edges 24, so as to further enhance the noise level. Higher $V_X$ induces more carriers along the STI edges 24, resulting in more noise. The octagonal geometry is thus essential for enhancing the noise adaptability, and the noise level can be adapted by means of the STI gate voltage $V_X$. Moreover, when $V_X$ is sufficiently high, for example, higher than 20V, the rectangular FET is also improved in noise adaptability.

Assuming that in FIG. 8 $V_D$=2.8V and $V_S=V_B$=0V, when $V_X$≤0V and $V_G$ is a positive voltage, it is called a main-enable mode, under which the measured drain current ($I_D$) becomes mainly dependent on $V_G$. When $V_G$≤−0.5V and $V_X$ is a positive voltage, it is called an STI-enable mode, under which the measured drain current ($I_D$) becomes mainly dependent on $V_X$. This characteristic facilitates measuring and comparing the noise induced by different gates (modes).

Figure 12:
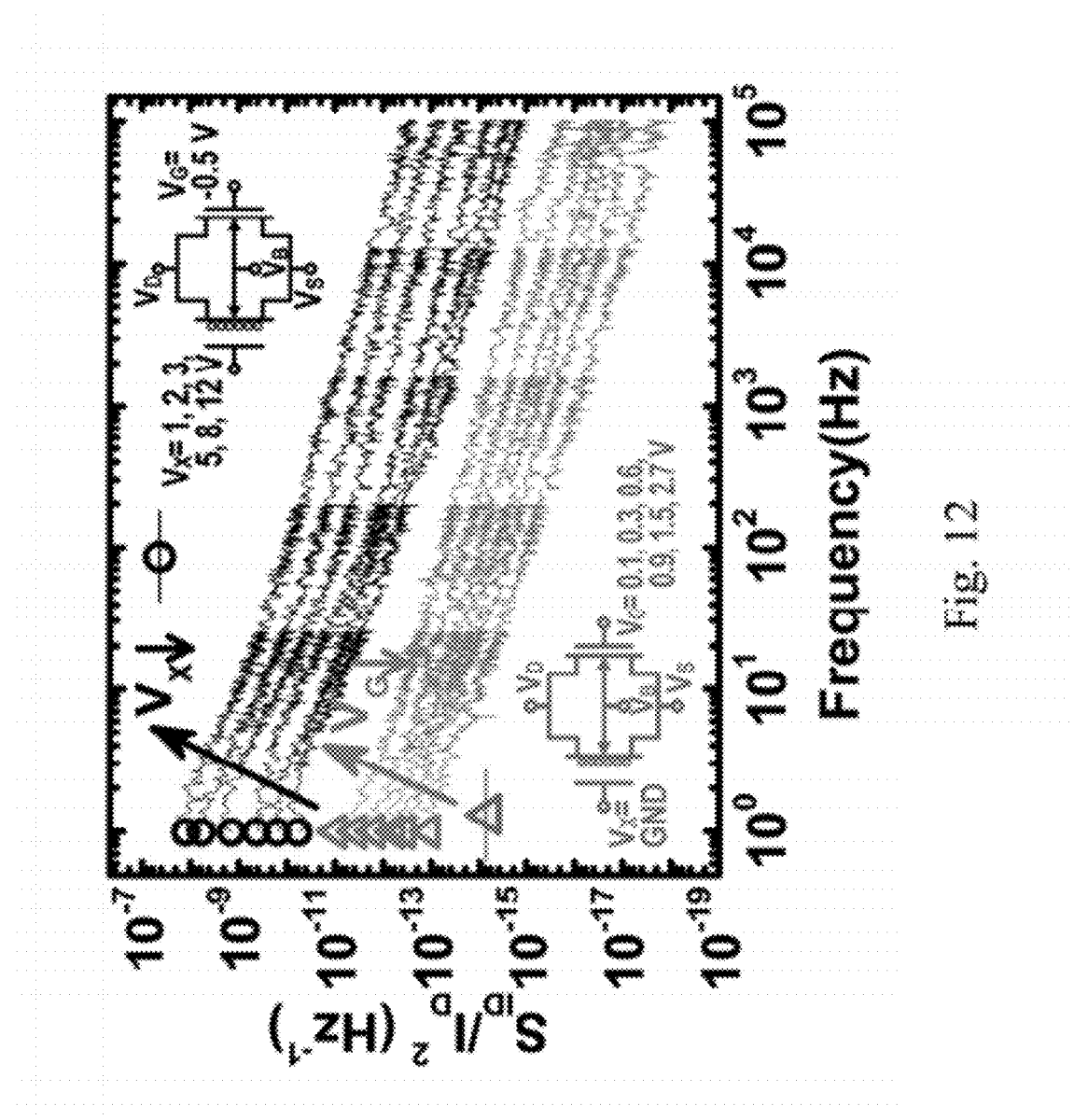
FIG. 12 is a diagram showing the comparison of noise adaptability between the main gate and the STI gate of the octagonal dual-gate FET shown in FIG. 8.

The noise adaptability of $V_G$ and $V_X$ of the ODGFET is further compared. The noise spectra ($S_{ID}$) at various $V_G$ and $V_X$ with $V_D$=2.8V and $V_S=V_B$=0V are measured and normalized with respect to $I_D^2$ for comparison. FIG. 12 shows that all normalized noise spectra in the STI-enable mode ($V_G$=−0.5V) are greater than those in the main-enable mode, indicating that carriers encounter much more interface traps in the STI-enable mode. In other words, the STI gate 22 is able to adapt noise in a more power-efficient manner, while the main gate 16 controls the drain biasing current more effectively. The distinctive roles of the two gates 16 and 22 provide great flexibility for the circuit design.

Figure 13:
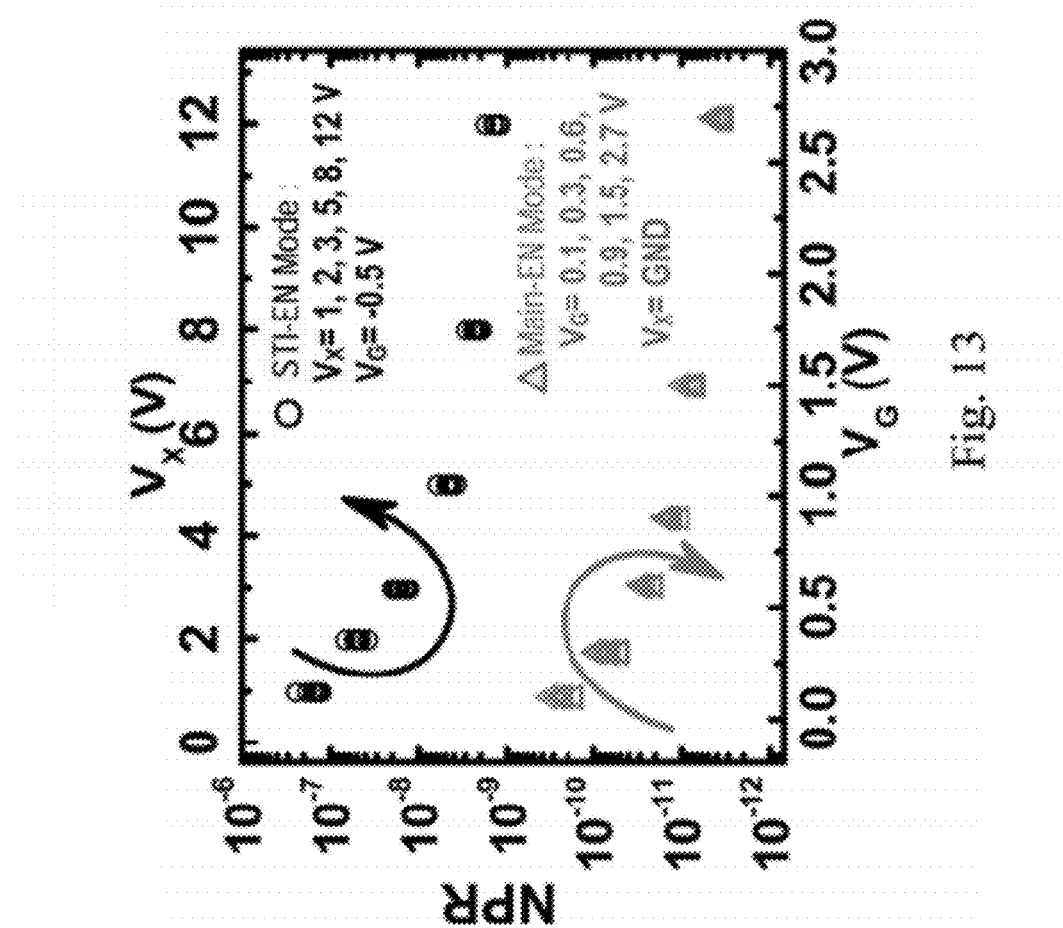
FIG. 13 is a diagram showing the comparison of noise power ratio between the main-enable mode and the STI-enable mode of the octagonal dual-gate FET shown in FIG. 8.

To investigate whether the variations of noise levels across devices would mask off the noise adaptability of the STI gate 22, the noise power ratios (NPRs) are measured for eight identical ODGFET testkeys. FIG. 13 shows $\int(S_{ID}/I_D^2)df$ as the result of using the normalized noise spectra of FIG. 12 to integrate the frequency. The eight identical ODGFET testkeys are referred to eight testkeys having an identical layout and distributed at eight locations of a same wafer. With the semiconductor process variation, the noise levels of the eight testkeys also have variation. The result that the NPR in the STI-enable mode is much greater than the NPR in the main-enable mode also demonstrates that the STI gate 22 is able to adapt noise level in a more power-efficient as compared with the main gate 16. More importantly, the STI gate 22 is able to modulate the NPRs by two decades, while the process variation in a same wafer merely causes the NPRs to alter by less than four times. The noise adaptability of the STI gate 22 is thus proved significant and useful. In addition, the adaptability is better when $V_X$≤5 V, allowing the circuit design to keep power-saving operation mode with low voltage and low power.

Figure 14:
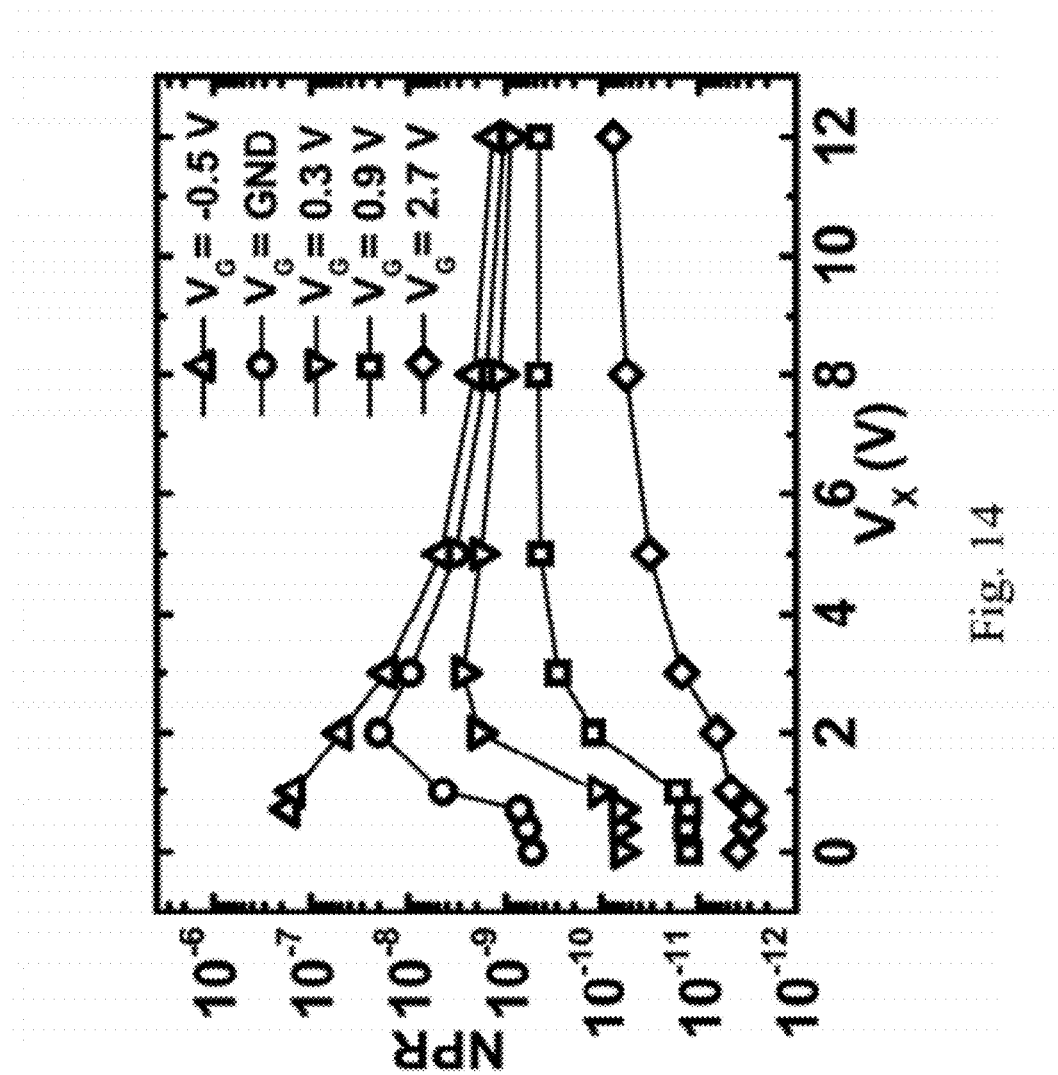
FIG. 14 is a diagram showing the characteristic curves of the noise power ratio to the STI gate voltage when the octagonal dual-gate FET shown in FIG. 8 is under various main gate voltages.

FIG. 12 and FIG. 13 illustrate the main-enable mode and the STI-enable mode of the ODGFET, or show the sole NPR adaptability of any of the transistors as one of the main transistor and the STI transistor of FIG. 5 is on while the other is off. FIG. 14 exhibits the joint NPR adaptability of the main gate 16 and the STI gate when the main transistor and the STI transistor of the ODGFET were on at the same time. The measurement result of FIG. 14 is also according to the ODGFET of FIG. 8. From FIG. 14, it is found that by applying voltages to the main gate 16 and the STI gate 22 at the same time, adaption of NPR could be also achieved, so FIG. 14 may be a reference for circuit designers to modulate noises. This device is applicable to any application where a double-end input ($V_X$ and $V_G$) and single-end output ($I_D$) structure is needed, such as a multiplier or a mixer.

The above tests are performed to an n-type FET, whereas those skilled in the art would obtain the same conclusion through tests with a p-type FET.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A multi-gate field-effect transistor with enhanced and adaptable low-frequency noise, comprising:
    a shallow trench isolation;
    an active region surrounded by the shallow trench isolation;
    a first gate above the active region, defining a channel; and
    a second gate above the shallow trench isolation and aside the channel, for encouraging channel carriers to flow along the STI edge to induce noise,
    wherein the first gate includes two portions at two opposite sides of the second gate.

2. The multi-gate field-effect transistor of claim 1, wherein the shallow trench isolation has corners in a direction along the length of the channel.

3. The multi-gate field-effect transistor of claim 1, wherein the active region has a polygonal layout.

4. The multi-gate field-effect transistor of claim 1, wherein the active region has a non-straight layout.

* * * * *